(12) United States Patent
Spiegelman et al.

(10) Patent No.: US 11,458,412 B2
(45) Date of Patent: Oct. 4, 2022

(54) CONTROLLED VAPOR DELIVERY INTO LOW PRESSURE PROCESSES

(71) Applicant: RASIRC, Inc., San Diego, CA (US)

(72) Inventors: Jeffrey J. Spiegelman, San Diego, CA (US); Zohreh Shamsi, San Diego, CA (US)

(73) Assignee: RASIRC, Inc., San Diego, CA (US)

( * ) Notice: Subject to any disclaimer, the term of this patent is extended or adjusted under 35 U.S.C. 154(b) by 37 days.

(21) Appl. No.: 16/962,996

(22) PCT Filed: Jan. 16, 2019

(86) PCT No.: PCT/US2019/013762
§ 371 (c)(1),
(2) Date: Jul. 17, 2020

(87) PCT Pub. No.: WO2019/143665
PCT Pub. Date: Jul. 25, 2019

(65) Prior Publication Data
US 2020/0338467 A1    Oct. 29, 2020

Related U.S. Application Data

(60) Provisional application No. 62/618,258, filed on Jan. 17, 2018.

(51) Int. Cl.
*B01D 1/14*    (2006.01)
*B01D 1/00*    (2006.01)
*C23C 16/448*    (2006.01)

(52) U.S. Cl.
CPC ............ *B01D 1/0082* (2013.01); *B01D 1/14* (2013.01); *C23C 16/448* (2013.01)

(58) Field of Classification Search
CPC .......................... B01D 1/0082; C23C 16/448
USPC ...................... 261/158, 101; 96/6
See application file for complete search history.

(56) References Cited

U.S. PATENT DOCUMENTS

| | | | |
|---|---|---|---|
| 10,150,048 B2* | 12/2018 | Alvarez, Jr. | ....... B01D 19/0068 |
| 10,196,685 B2* | 2/2019 | Alvarez, Jr. | ............ A61L 2/186 |
| 10,363,497 B2* | 7/2019 | Spiegelman | ....... B01D 19/0031 |
| 2004/0056368 A1* | 3/2004 | Hirahara | ................. C30B 25/14 |
| | | | 261/64.3 |
| 2006/0021615 A1 | 2/2006 | Kertzman | |
| 2006/0125129 A1* | 6/2006 | Takamatsu | .......... C23C 16/4485 |
| | | | 261/142 |
| 2007/0107594 A1* | 5/2007 | Piccinini | ................ B01D 63/08 |
| | | | 95/52 |

(Continued)

OTHER PUBLICATIONS

PCT/US2019/013762 International Search Report and Written Opinion dated May 10, 2019.

*Primary Examiner* — Nina Bhat
(74) *Attorney, Agent, or Firm* — Wagenknecht IP Law Group PC

(57) ABSTRACT

Provided herein are methods, systems, and device for control, delivery, and purification of low vapor pressure gases in conjunction with carrier gas in micro-electronics and other critical process applications. The present invention is based on the observation that when temperature and pressure of a device for delivering a gas stream are held constant, the concentration of vapor in the gas stream may be modulated based on the level of liquid within the chamber thereof.

26 Claims, 3 Drawing Sheets

(56) References Cited

U.S. PATENT DOCUMENTS

| | | | | |
|---|---|---|---|---|
| 2009/0014901 A1* | 1/2009 | Spiegelman | ........ | C23C 16/4481 |
| | | | | 261/128 |
| 2010/0107877 A1* | 5/2010 | Suzuki | ................... | B01D 63/02 |
| | | | | 96/6 |
| 2015/0068611 A1* | 3/2015 | Alvarez, Jr. | ........ | C23C 16/4481 |
| | | | | 137/13 |
| 2015/0329901 A1* | 11/2015 | Alvarez, Jr. | ......... | C12Q 1/6848 |
| | | | | 422/28 |
| 2017/0216738 A1* | 8/2017 | Alvarez, Jr. | .......... | C23C 16/448 |
| 2017/0369315 A1* | 12/2017 | Alvarez, Jr. | ....... | B01D 19/0068 |

\* cited by examiner

CONTROLLED VAPOR DELIVERY INTO LOW PRESSURE PROCESSES

CROSS REFERENCE TO RELATED APPLICATION(S)

This application is a US national phase application under 35 U.S.C. § 371 of international patent application no. PCT/US2019/013762, filed Jan. 16, 2019, which claims the benefit of priority under 35 U.S.C. § 119(e) of U.S. Ser. No. 62/618,258, filed Jan. 17, 2018, the entire content of each of which is incorporated herein by reference.

BACKGROUND OF THE INVENTION

Field of the Invention

A device is provided for control, delivery, and purification of low vapor pressure gases in conjunction with carrier gas in micro-electronics and other critical process applications.

Background Information

Vapors of water and other liquids are used in many applications in current advanced technology processes, including processes employed in micro-electronics manufacturing, as well as in clean room and medical applications. Desirably, such vapors should introduce minimal impurities into a process, such that they can be used, e.g. for the oxidation of silicon, in the production of thin gate oxides (e.g., in the electronics and micro-electronics industries), and in ultra-high purity cleaning processes. However, delivery of liquid vapor (such as, e.g., water, alcohols, or amines) to a process using conventional methods is difficult, and the choices are typically limited to direct liquid injection (DLI) or bubblers, each of which tend to introduce contaminants along with liquid vapor.

At lower flow rates, control has limited accuracy, and at higher flow rates, DLI is susceptible to introducing bubbles in the liquid which generate erratic flow rate values. DLI utilizes a metallic vaporizer or a metal hot plate to convert the liquid to gas, and can vaporize only limited quantities of liquid due to thermal transfer rates. Other disadvantages to DLI are that contamination can build up on the hot plate, and there is a potential for chemical decomposition of certain liquids. The greatest disadvantage of DLI, however, is that it cannot provide any purification of the liquid being vaporized, since everything in the liquid, including contaminants and impurities, is vaporized and introduced into the process.

Bubblers have the advantage of being a low cost option. However, bubblers are inaccurate and imprecise, due to poor control of the temperature of the gas, the temperature of the liquid, the operating pressure, the liquid level, and thermal droop. Bubblers offer somewhat better performance than DLI as to entrainment of contaminants, since bubblers leave behind at least a portion of the contaminants during the vaporization process, but bubblers cannot prevent entrainment of dissolved gases, volatile molecular contaminants, and micro-droplets which can carry particulate and ionic molecular contaminants.

In the medical industries, water vapor can be used for humidification. Such water vapor when produced using conventional systems can yield a product having, e.g., prions, viruses, allergens, proteins, bacteria, and other biologically active macromolecules or substances present. Additionally, inorganic substances, such as borates and silicates or metallic substances such as iron, nickel, chromium, copper, and other toxic metals can be present.

Typically, water for micro-electronics applications is produced by reacting gaseous hydrogen and oxygen to yield water vapor. The production of pure water vapor is practically impossible due to the presence of residual oxygen and/or hydrogen remaining in the product water vapor. Removing these components often requires additional expensive and complex separation processes. Additionally, high concentrations of gaseous hydrogen are often required for the synthesis reaction with oxygen, which is conducted at high temperatures well above the explosive limit of hydrogen (approximately 8% at a pressure of approximately 100 kPa).

The simple boiling of high purity de-ionized water to yield water vapor can avoid the problems and dangers inherent in the direct reaction of hydrogen and oxygen to yield steam. However, removing dissolved gases can be difficult and often requires multiple boiling/condensation cycles in a hermetically sealed environment, which can be expensive. Moreover, aerosols containing materials that are not normally volatile, such as salts or metals, can be produced during the boiling process and can add unwanted impurities. Therefore, a need exists for a device for delivering a gas stream to a critical process or application, such as microelectronics manufacturing.

SUMMARY OF THE INVENTION

The present invention is based on the observation that when temperature and pressure of a device for delivering a gas stream are held constant, the concentration of vapor in the gas stream may be modulated based on the level of liquid within the chamber thereof Accordingly, in one aspect, the invention provides a device for delivering a gas stream. The device includes an enclosed chamber having a fill port, an inlet port and an outlet port, wherein the chamber is configured to contain a liquid, a tubular support disposed within the chamber and having an interstitial space in fluid communication with the inlet port and the outlet port, wherein the tubular support comprises a plurality of through-holes disposed along a length thereof, and a membrane surrounding the tubular support, wherein the membrane is configured to permit passage therethrough of a vapor phase of the liquid, whereby the vapor phase passes through the membrane to contact a carrier gas or vacuum within the interstitial space to form a gas stream, wherein a concentration of the vapor at the outlet port is controlled by one or more of temperature of the chamber, pressure within the interstitial space, flow rate of the carrier gas if present, the number of holes disposed in the tubular support, the diameter of the holes disposed in the tubular support, and the alignment of the holes relative to a level of liquid within the chamber. In various embodiments, the membrane is a substantially gas-impermeable membrane, such as a perfluorinated ion-exchange membrane, and preferably the membrane is formed from NAFION®. In various embodiments, the membrane is configured to permit the vapor phase of the liquid to pass therethrough at a vapor mass flow rate of about 10 gm/min to about 0.01 mg/min, such as about 5 gm/min to about 5.0 mg/min. In various embodiments, the membrane is configured to permit the vapor phase of the liquid to pass therethrough at a vapor mass flow rate of about 1.0 gm/min to about 1.0 mg/min, such as 0.5 gm/min to about 0.50 mg/min.

In various embodiments, the device also includes a mass flow controller disposed at the inlet port and configured to control flow rate of the carrier gas between about 100.0

Standard Liters/min (slm) to 0.001 slm. In various embodiments, the mass flow controller is configured to control flow rate of the carrier gas between about 100 slm and 0.01 slm. In various embodiments, the device also includes a level detector disposed within the chamber and configured to monitor an amount of liquid in the chamber. In various embodiments, the device also includes a downstream pressure controller disposed at the outlet port and configured to deliver the gas stream into a sub-atmospheric process. In various embodiments, the pressure controller is configured to perform at least one of maintaining a pressure of about 0-100 bara at the outlet, and maintaining a pressure of about 1 bara within the chamber. In various embodiments, the device also includes a thermal controller disposed within the chamber and configured to perform at least one of adding heat to the carrier gas, adding heat to the chamber, removing heat from the carrier gas, and removing heat from the chamber. In various embodiments, the thermal controller may be disposed on a carrier gas delivery line connected to the input port of the device, where the thermal controller is configured to add heat to the carrier gas. In various embodiments, the thermal controller is configured to maintain a temperature of the liquid contained in the chamber at about 0° to 110° C. In various embodiments, the device also includes an exhaust valve in fluid communication with a head space within the chamber, wherein the head space is adjacent to the liquid.

In various embodiments, the liquid is selected from the group consisting of water, alcohols, hydrazine, and hydrogen peroxide. In various embodiments, the carrier gas, if present, is selected from the group consisting of nitrogen, argon, hydrogen, clean dry air, helium, ammonia, ozone, carbon dioxide, carbon monoxide, oxygen, hydrocarbons, and mixtures thereof. In various embodiments, the tubular support is formed from stainless steel, nickel, hastelloy, copper, polytetrafluoroethylene (PTFE), or PerFluoro-Alkoxy (PFA).

In another aspect, the invention provides a method of delivering a gas stream. The method includes providing a liquid in the device described herein, contacting a carrier gas or vacuum with the vapor phase of the liquid to form a gas stream within the interstitial space, and delivering the gas stream to a critical process or application, wherein a concentration of the vapor at the outlet port is controlled by one or more of temperature of the chamber, pressure within the interstitial space, flow rate of the carrier gas if present, the number of holes disposed in the tubular support, the diameter of the holes disposed in the tubular support, and the alignment of the holes relative to a level of liquid within the chamber. In various embodiments, the membrane is a substantially gas-impermeable membrane, such as a perfluorinated ion-exchange membrane. In various embodiments, the membrane is formed from NAFION®. In various embodiments, the vapor phase of the liquid to passes through the membrane at a vapor mass flow rate of about 10 gm/min to about 0.01 mg/min, such as about 5 gm/min to about 5.0 mg/min. In various embodiments, the vapor phase of the liquid passes through the membrane at a vapor mass flow rate of about 1.0 gm/min to about 1.0 mg/min, such as 0.5 gm/min to about 0.50 mg/min.

In various embodiments, the liquid is selected from the group consisting of water, alcohols, hydrazine, and hydrogen peroxide. In various embodiments, the carrier gas, if present, is selected from the group consisting of nitrogen, argon, hydrogen, clean dry air, helium, ammonia, ozone, carbon dioxide, carbon monoxide, oxygen, hydrocarbons, and mixtures thereof.

DETAILED DESCRIPTION OF THE INVENTION

Figure 1:
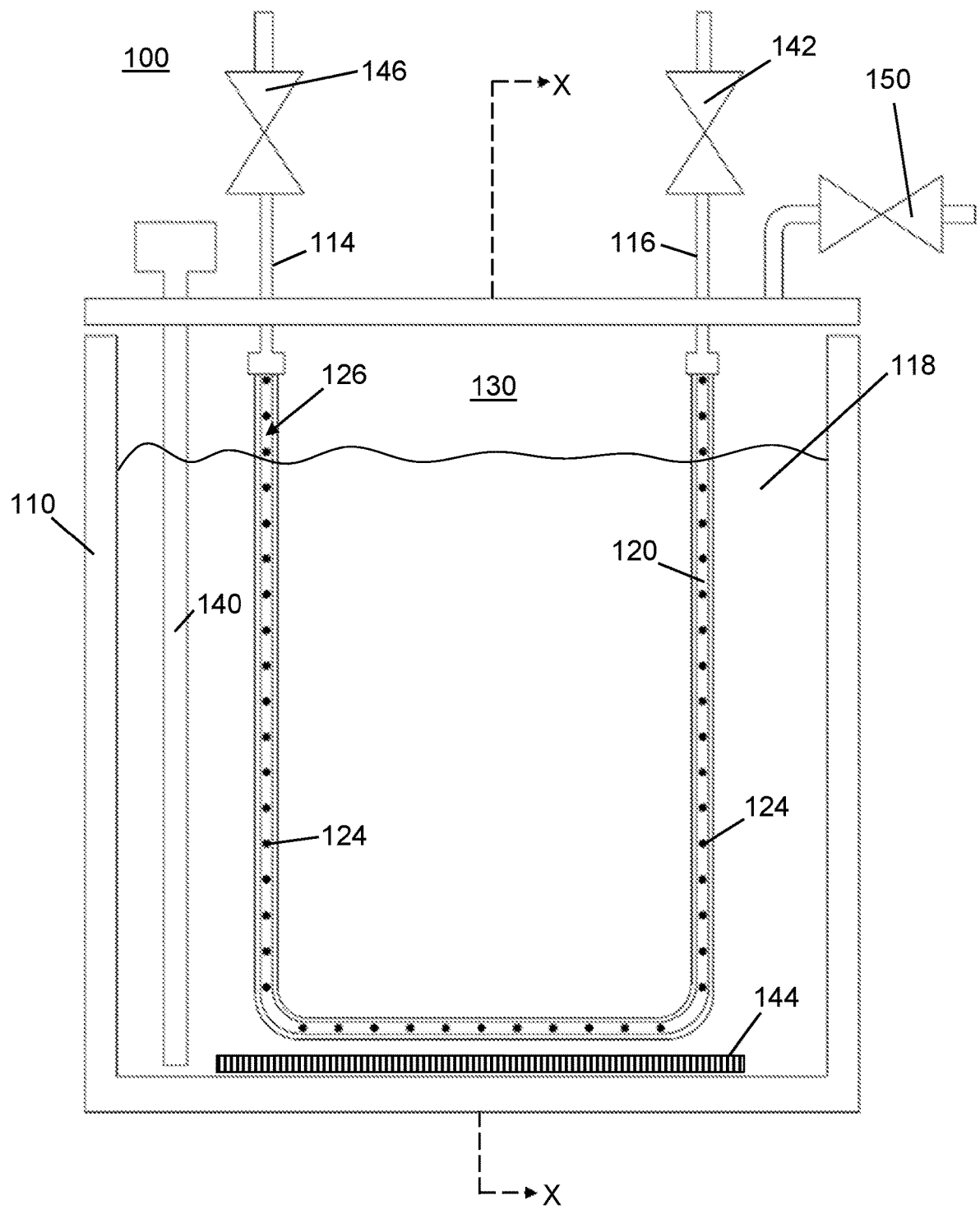
FIG. 1 is a pictorial diagram showing an exemplary device for controlled vapor delivery into low pressure processes.

The present invention is based on the observation that when temperature and pressure of a device for delivering a gas stream are held constant, the concentration of vapor in the gas stream may be modulated based on the level of liquid within the chamber thereof. As such, the present invention provides a device referred to as "the RHA" (RainMaker Humidification Assembly), which allows for the delivery of purified water vapor into low pressure processes such as Atomic Layer Deposition (ALD) and Chemical Vapor Deposition (CVD).

Before the present compositions and methods are described, it is to be understood that this invention is not limited to particular compositions, methods, and experimental conditions described, as such compositions, methods, and conditions may vary. It is also to be understood that the terminology used herein is for purposes of describing particular embodiments only, and is not intended to be limiting, since the scope of the present invention will be limited only in the appended claims.

As used in this specification and the appended claims, the singular forms "a", "an", and "the" include plural references unless the context clearly dictates otherwise. Thus, for example, references to "the method" includes one or more methods, and/or steps of the type described herein which will become apparent to those persons skilled in the art upon reading this disclosure and so forth.

The term "comprising," which is used interchangeably with "including," "containing," or "characterized by," is inclusive or open-ended language and does not exclude additional, unrecited elements or method steps. The phrase "consisting of" excludes any element, step, or ingredient not specified in the claim. The phrase "consisting essentially of" limits the scope of a claim to the specified materials or steps and those that do not materially affect the basic and novel characteristics of the claimed invention. The present disclosure contemplates embodiments of the invention compositions and methods corresponding to the scope of each of these phrases. Thus, a composition or method comprising recited elements or steps contemplates particular embodiments in which the composition or method consists essentially of or consists of those elements or steps.

"About" as used herein means that a number referred to as "about" comprises the recited number plus or minus 1-10% of that recited number. For example, "about" 100 degrees can mean 95-105 degrees or as few as 99-101 degrees depending on the context. Whenever it appears herein, a numerical range such as "1 to 20" refers to each integer in the given range; i.e., meaning only 1, only 2, only 3, etc., up to and including only 20.

The term "process gas" as used herein is a broad term, and is to be given its ordinary and customary meaning to a person of ordinary skill in the art (and is not to be limited to a special or customized meaning), and refers without limitation to a gas that is used in an application or process, e.g., a step in the manufacturing or processing of micro-electronics and in other critical processes. Exemplary process gases are reducing agents, oxidizing agents, inorganic acids, organic acids, inorganic bases, organic bases, and inorganic and organic solvents. Specific examples of process gases include, but are not limited to, water, alcohols, hydrazine, and hydrogen peroxide.

The term "carrier gas" as used herein is a broad term, and is to be given its ordinary and customary meaning to a person of ordinary skill in the art (and is not to be limited to a special or customized meaning), and refers without limitation to a gas that is used to carry another gas through a process train, which is typically a train of piping. Exemplary carrier gases include, but are not limited to, nitrogen, argon, hydrogen, oxygen, CO2, clean dry air, helium, ammonia, or other gases that are stable at room temperature and atmospheric pressure. In various embodiments, the carrier gas may be a substantially dry carrier gas.

The term "head space" as used herein is a broad term, and is to be given its ordinary and customary meaning to a person of ordinary skill in the art (and is not to be limited to a special or customized meaning), and refers without limitation to a volume of gas in fluid contact with a process chemical solution (e.g., water) that provides at least a portion of the vapor phase (i.e., process gas) contained in the head space. There may be a permeable or selectively permeable barrier wholly or partially separating the head space that is optionally in direct contact with the process chemical solution. In those embodiments where the membrane is not in direct contact with the process chemical solution, more than one head space may exist, i.e., a first head space directly above the solution that contains the vapor phase of the solution and a second head space separated from the first head space by a membrane that only contains the components of the first head space that can permeate the membrane, e.g., water. In those embodiments with a water solution and a head space separated by a substantially gas-impermeable membrane, the head space may be located above, below, or on any side of the chemical solution, or the head space may surround or be surrounded by the water solution. For example, the head space may be the interstitial space inside a substantially gas-impermeable tube running through the water solution or the water solution may be located inside a substantially gas-impermeable tube with the head space surrounding the outside of the tube. The head space is also the space surrounding the substrate in which the chemical solution is present in the gas phase in a manner that allows for transport to critical processes by way of carrier gas or vacuum.

The term "substantially gas-impermeable membrane" as used herein is a broad term, and is to be given its ordinary and customary meaning to a person of ordinary skill in the art (and is not to be limited to a special or customized meaning), and refers without limitation to a membrane that is permeable to water vapor but relatively impermeable to other gases such as, but not limited to, hydrogen, nitrogen, oxygen, carbon monoxide, carbon dioxide, hydrogen sulfide, hydrocarbons (e.g., ethylene), volatile acids and bases, refractory compounds, and volatile organic compounds. Gas impermeability can be determined by the "leak rate" of the membrane. The term "leak rate" as used herein is a broad term, and is to be given its ordinary and customary meaning to a person of ordinary skill in the art (and is not to be limited to a special or customized meaning), and refers without limitation to the volume of a particular gas that penetrates the membrane surface area per unit of time.

Unless defined otherwise, all technical and scientific terms used herein have the same meaning as commonly understood by one of ordinary skill in the art to which this invention belongs. Although any methods and materials similar or equivalent to those described herein can be used in the practice or testing of the invention, the preferred methods and materials are now described.

The methods and devices described herein are particularly well suited for use in delivering water vapor to micro-electronics processes. Water vapor is used, e.g., in rapid thermal processing (RTP), atomic layer deposition (ALD), plasma stripping, and diffusion. For ALD, RTP, and diffusion, water vapor is employed to grow oxides. As discussed above, water is often generated in a pyrolitic process to ensure the purity of the water vapor. Difficulties with such pyrolitic processes include the need for combusting oxygen and hydrogen, the need for external torches on the diffusion chambers to prevent the 800° C. heat necessary for the pyrolitic process from changing the thermal profile of the tool, particulation of the torch tip, long startup and shut down times, safety issues associated with hydrogen use, and problems associated with excess hydrogen in the chamber. In addition, such systems have difficulty operating properly with very low flow rates or low water vapor to hydrogen ratios.

In order to produce high quality micro-electronics products, stringent control of humidity in the clean room containing fabrication devices is necessary. The humidity in micro-electronics (or medical) clean rooms requires very tight control of purity of the air. The humidity of the incoming air is conventionally controlled by injecting clean steam during cold and dry environmental conditions. If the steam contains contaminants, these contaminants are transferred into the air and into the clean rooms. This can detrimentally affect yield. Urea and chloroform are known contaminants that are carried in pure steam and are especially problematic in state of the art micro-electronics fabrication facilities. By using the methods and devices described herein, humidity can be precisely controlled without transfer of contaminants into the air or clean room.

In contrast to the prior art methods of adding vapor to a carrier gas, the methods and devices described herein permit purified vapor to be added in a controlled fashion to a carrier gas or vacuum.

Each liquid has a known vapor pressure for a given temperature. A gas that contacts a liquid will become saturated with this vapor. Water, for example, has a vapor pressure of 1 atmosphere at 100° C. The gas that results from contact of a carrier gas with a liquid is composed of a combination of the vapor and the carrier gas. Under ideal conditions, the mass of source vapor that are carried away by the carrier gas is equal to the mass flow rate of the carrier gas contacting the source times the vapor pressure of the source divided by the total system pressure less the vapor pressure of the source. For a given device and mass flow rates, this number can be fixed with precision if the temperature of the carrier gas and the liquid source, the system pressure, and carrier gas flow rate are tightly controlled.

There are a number of ways by which this control can be accomplished. In various embodiments, a non-porous membrane is employed to provide a barrier between the liquid source and the carrier gas or vacuum. The molecules from the liquid source rapidly permeate across the membrane, while the carrier gas, if present, is excluded from diffusing across the membrane into the liquid. The liquid source is diffusion-driven by a concentration gradient between the liquid and the carrier gas. This flow stops once the carrier gas has been fully saturated to the resulting source vapor pressure for the specific temperature at the membrane.

Because the membrane is designed specifically to select only the source gas molecules, other contaminants in the liquid source cannot permeate across the membrane and cannot then enter into the carrier gas stream. The membrane excludes particles, micro-droplets, volatile gases, and other opposite-charged species. For example, a hydrophilic membrane can be employed to exclude hydrophobic gases, and a hydrophobic membrane can be employed to exclude hydrophilic gases.

As shown in FIG. 1, the device 100 of the present invention includes an enclosed chamber 110 having a fill port 150, an inlet port 114 and an outlet port 116, wherein the chamber 110 is configured to contain a liquid 118, a tubular support 120 disposed within the chamber and having an interstitial space 122 in fluid communication with the inlet port 114 and the outlet port 116, wherein the tubular support 120 comprises a plurality of through-holes 124 disposed along a length thereof, and a membrane assembly 126 surrounding the tubular support, wherein the membrane assembly 126 is configured to permit passage therethrough of a vapor phase of the liquid 118, whereby the vapor phase passes through the membrane assembly 126 to contact a carrier gas or vacuum within the interstitial space 122 to form a gas stream, wherein a concentration of the vapor at the outlet port 116 is controlled by one or more of temperature of the chamber, pressure within the interstitial space, flow rate of the carrier gas if present, the number of through-holes 124 disposed in the tubular support 120, the diameter of the through-holes 124 disposed in the tubular support 120, and the alignment of the through-holes 124 relative to a level of liquid 118 within the chamber 110.

Figure 2:
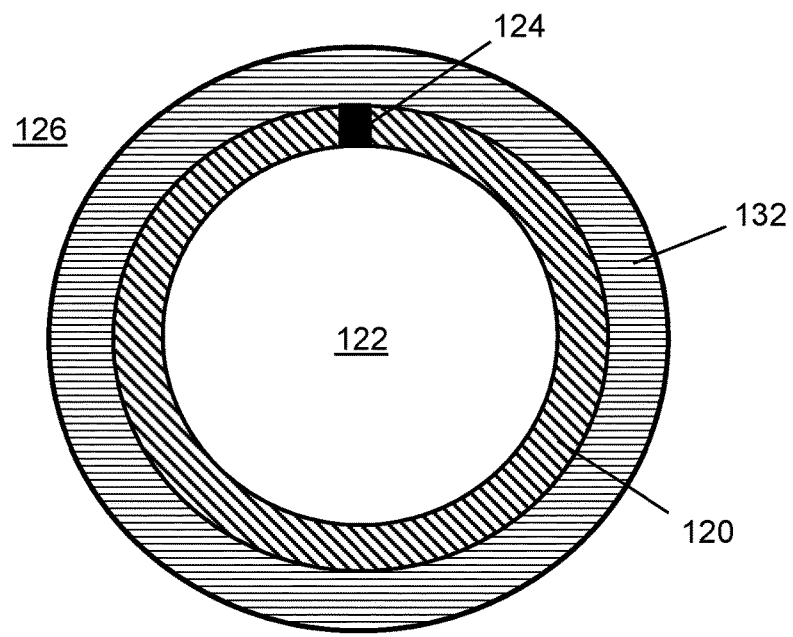
FIG. 2 is a pictorial diagram showing a cross-sectional view of an exemplary membrane assembly of the device for controlled vapor delivery into low pressure processes.

Accordingly, the membrane assembly 126 separates the liquid 118 (e.g., water) and its interstitial space 122 from directly seeing the process vacuum, when vacuum is used in place of a carrier gas. In various embodiments, as shown in FIG. 2, the membrane assembly 126 includes a tubular hydrophilic membrane 132 that is backed by a tubular support 120 to prevent collapse of the membrane 132 when low pressure is placed on the process side (i.e., outlet port 116). The tubular support 120 has a series of through-holes 124 disposed along its length that are configured to allow the membrane 132 to be exposed to the process environment downstream. In various embodiments, the membrane assembly 126 can be substantially U-shaped to enable both a horizontal and vertical alignment of the through-holes 124 relative to the axis X of the chamber 110. However, membrane assembly 126 may be formed in any shape sufficient to allow for immersion within the liquid 118 contained in the chamber 110. In various embodiments, the tubular support 120 may be formed from stainless steel, nickel, hastelloy, copper, polytetrafluoroethylene (PTFE), or PerFluoroAlkoxy (PFA).

As such, the amount of process gas (e.g., water vapor) delivered to a critical process, application, or storage vessel may be externally controlled by the temperature of the chamber 110, pressure on the downstream process side (i.e., outlet port 116) of the chamber 110, and flow rate of a carrier gas, if any. In various embodiments, the amount of process gas (e.g., water vapor) delivered to the critical process, application, or storage vessel may also be internally controlled by varying the number of through-holes 124 disposed in the tubular support 120 of the membrane assembly 126, the diameter of the through-holes 124, and/or the alignment of the through-holes 124 relative to the level of the liquid 118 in the chamber 110. For example, the more through-holes 124 on the vertical leg(s) of the membrane assembly 126 that are submerged in the liquid 118, the more process gas (e.g., water vapor) is delivered.

The membrane assembly 126 therefore allows for the mass transfer of a process gas (e.g., water vapor) at a known diffusion rate for a given set of parameters (i.e., temperature, pressure, surface area, carrier gas flow rate). However, the mass transfer rate for the membrane 132, when immersed in a process liquid (e.g., water), is much higher than when exposed to the head space 130 above the liquid level in the chamber 110. In various embodiments, the transfer rate may be about 10× to about 100× faster than in liquid phase. In various embodiments, the membrane is configured to permit the vapor phase of the liquid to pass therethrough at a vapor mass flow rate of about 10 gm/min to about 0.01 mg/min, such as about 5 gm/min to about 5.0 mg/min. In various embodiments, the membrane is configured to permit the vapor phase of the liquid to pass therethrough at a vapor mass flow rate of about 1.0 gm/min to about 1.0 mg/min, such as 0.5 gm/min to about 0.50 mg/min. Thus, by controlling the level of the liquid 118 in the chamber 110, the number of through-holes 124 in the membrane assembly 126 that are immersed in the liquid 118 can be varied. As such, the amount of process gas delivered to the critical process, application, or storage vessel can be controlled independent of the other parameters by controlling the number of holes immersed in the liquid 118.

In addition, by having a membrane 132 contiguously separate the liquid 118 and interstitial space 122 from the critical process, application, or storage vessel, liquid droplets are prevented from entering the gas delivered to the critical process, application, or storage vessel, which can occur as a result of bubbling a carrier gas through the liquid or having a dissolved gas boil out of the liquid when exposed suddenly to a vacuum.

As discussed above, the device 100 may be configured for the transfer of water vapor to a critical process or application. In such embodiments, a fluoropolymer membrane which contains sulfonic acid groups may be employed. Such membranes are commercially available under the tradename of NAFION® by E. I. du Pont de Nemours and Company, Wilmington, Del., and allow for the rapid transfer of water vapor into a carrier gas. While the aforementioned carrier gases are particularly preferred, other carrier gases can also be employed. Accordingly, suitable carrier gases can include CO2, argon, ozone, corrosive or reactive gases as are employed in the micro-electronics industry, hydrocarbons (acetylene, 2,2-dimethylpropane, allene, ethane, 1,2-butadiene, ethyl acetylene, 1,3-butadiene, ethylene, isobutane, n-hexane, n-butane, methane, 1-butene, methyl acetylene, cis-2-butene, 2-methylbutane, 3-methylbutane, trans-2-butene, n-pentane, isobutylene, propane, cyclopropane, propylene, dimethylacetylene, toluene, dimethyl ether, vinyl acetylene), halogenated hydrocarbons (chloroform, trichloroethylene, halothane, methoxyflurane, fluoroxene, and enflurane, hydrochlorofluorocarbons, and hydrofluorocarbons), other halogenated gases such as sulfur hexafluoride, and the like.

As discussed above, the non-porous membrane 132 of the membrane assembly 126 prevents dissolved gases, most volatile contaminants, particles, and microdroplets from being transferred into the carrier gas or vacuum, such that the resulting gas stream is more consistent in composition and significantly more pure. Because it works on the basis of 100% saturation of the carrier gas or vacuum, the device 100 described herein can be cycled on and off without a significant effect on accuracy. With a properly sized membrane surface area, saturation values of greater than 95% are possible (e.g., 96%, 97%, 98%, 99% or even 100%). As the carrier gas flow rate increases for a given surface area, a saturation value below 100% can be obtained. With increasing carrier gas flow rate, the amount of vapor declines from 100% relative humidity to less than 1% relative humidity. Accordingly, by adjusting the carrier gas flow rate, the percent saturation can be precisely controlled. The saturation levels are repeatable and based on the control system parameters, and can typically be controlled to a variation of 10% or less, 5% or less, or even 1% or less.

In various embodiments, the device 100 may also include a mass flow controller 146 disposed at or near the inlet port 114 and configured to control flow rate of the carrier gas flowing through the inlet port 114 at between about 100 slm and about 0.001 slm. In various embodiments, the mass flow controller 146 is configured to control flow rate of the carrier gas between about 100 slm and 0.001 slm. In various embodiments, the device may also include a level detector 140 disposed within the chamber 110 and configured to monitor an amount or level of liquid 118 within the chamber 110. In various embodiments, the device may also include a downstream pressure controller 142 disposed along the outlet port 116 and in fluid communication with the interstitial space 122, where the downstream pressure controller 142 is configured to deliver the gas stream into a subatmospheric process. In various embodiments, the pressure controller is configured to perform at least one of maintaining a pressure of about 0-100 bara at the outlet port 116 and maintaining a pressure of about 1 bara within the chamber 110.

In various embodiments, additional liquid 118 (e.g., water) may be added to the chamber 110 through fill port 150 of device 100 during delivery of the gas stream to the critical process or application (i.e., during contacting the carrier gas with the vapor phase of the liquid). In various embodiments, the fill port 150 of device 100 may further be configured to function as an exhaust valve since fill port 150 is in fluid communication with the head space 130 within the chamber 110. As such, the fill port/exhaust valve 150 may be configured to maintain a pressure of about 1 bara within the chamber 110. In various embodiments, fill port/exhaust valve 150 may be used to degas the liquid 118 while the carrier gas flows through the interstitial space 122 of the membrane assembly 126. As such, removal of dissolved gas from the liquid 118 may be accomplished while the gas stream is being delivered to the critical process or application.

In various embodiments, the device may also include a thermal controller 144 disposed within the chamber 110 or adjacent to the chamber 110, where the thermal controller 144 is configured to perform at least one of adding heat to the carrier gas, adding heat to the chamber 110, removing heat from the carrier gas, and removing heat from the chamber 110. In various embodiments, the thermal controller 144 may be disposed on a carrier gas delivery line 160 connected to the input port 114 of the device 100, where the thermal controller 144 is configured to add heat to the carrier gas. In various embodiments, the thermal controller 144 is configured to maintain a temperature of the liquid 118 contained in the chamber 110 at about 0° to 110° C. In various embodiments, when temperature and pressure of the device 100 are held constant, the concentration of vapor in the gas stream is modulated based on a level of liquid 118 within the chamber 110.

The methods and devices described herein offer numerous advantages over prior art systems. For example, use of device 100 provides: prevention of microdroplets into the process by the membrane; prevention of particles and metals contamination by the membrane; reduced atmospheric contaminants as the chamber/ampoule will be filled and degassed before shipment; extended control of the low end range for delivery of water vapor by restricted water vapor flow to chamber due to membrane which will enable longer water vapor pulses; better ALD film control; allow for refilling liquid while supplying process vapor; tubular support allows thin wall membrane to be used without collapse; control of water vapor delivery by varying the size, number, and alignment of holes in the support tube. Thus, in various embodiments, water vapor or process gas may be introduced into a carrier gas or vacuum within the interstitial space 122 of the tubular support 120 of the membrane assembly 126.

EXAMPLE 1

Delivery of Water Vapor

Figure 4:
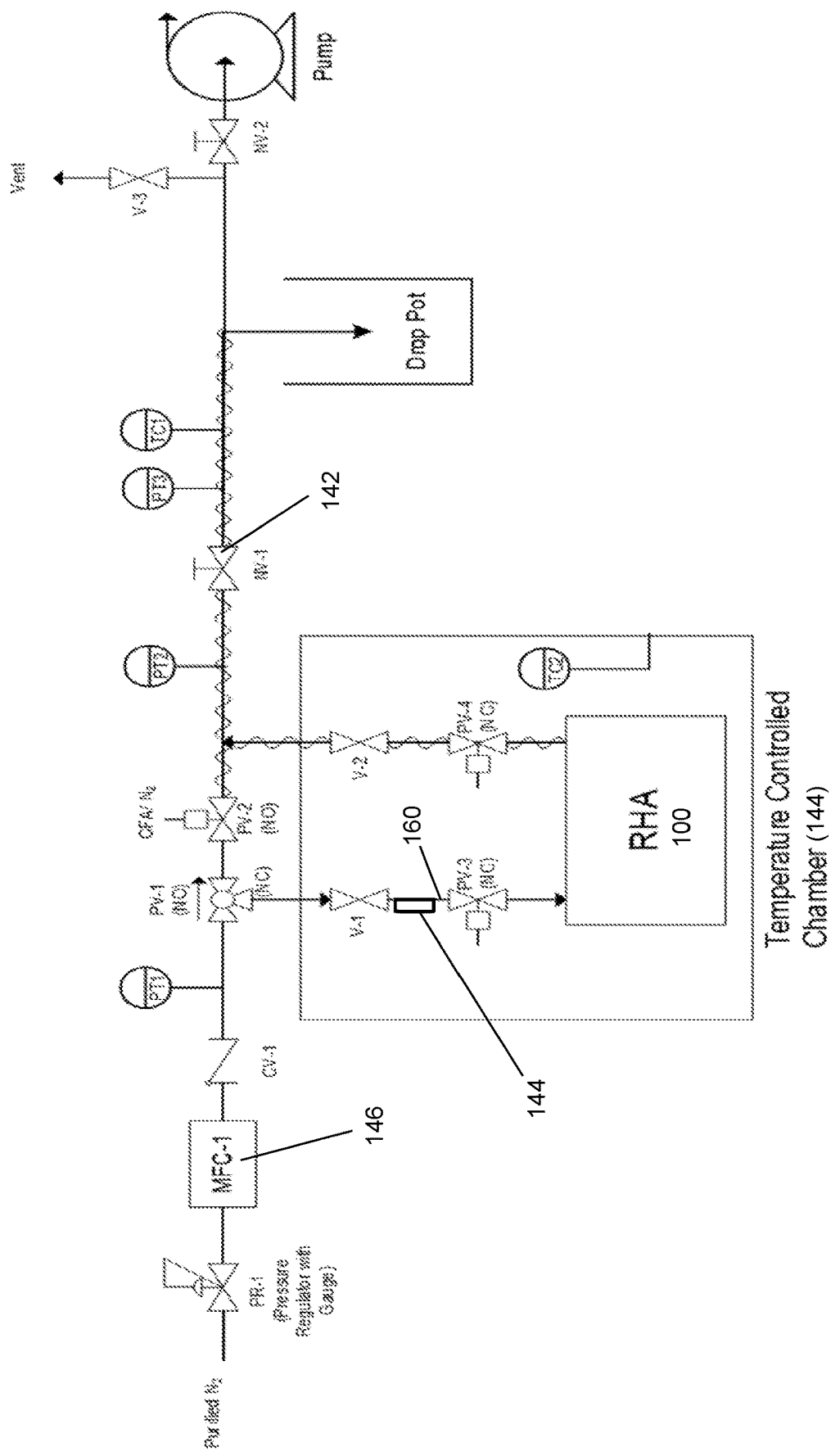
FIG. 4 is a pictorial diagram of an exemplary P&ID used for testing according to various embodiments of the present disclosure.

This example provides test information of the device for delivery of water vapor. As shown in FIG. 4, purified $N_2$ gas was maintained at 25 psig using a forward pressure regulator with gauge (PR-1). A 0.2 slm or 200 sccm SLA5850 Brooks Mass Flow Controller (Accuracy: 0.9% of SP for 20-100% FS and 0.18% of FS for 2-20% FS) (MFC-1) was used to supply $N_2$ gas to the test setup. A ⅓ psi check valve (CV-1) was placed downstream of MFC-1 to prevent any backflow to the MFC. The device 100 was filled with DI water to demonstrate the ability to add $H_2O$ vapor to the carrier gas. A 1000 Torr pressure transducer (PT-1) was used to monitor the pressure upstream of the device 100. A second 1000 Torr pressure transducer (PT-2) was used to monitor the pressure downstream of the device 100.

The device 100 was placed inside a temperature-controlled chamber. The chamber's temperature was monitored with a thermocouple (TC-1). Two pneumatic inlet and outlet valves (V-1 and V-2) on the lid of device 100 were used to isolate the device. A mixing valve (Swagelok (EF7639 6LW-DPC111P-1-C)) (PV-1) along with a normally open pneumatic valve (Parker (19AC 4V1-P4K-12A0-SS-PP IACN)) (PV-2) were used to switch the carrier gas between the bypass and process (through device 100). A needle valve (Nupro SS-4BRG VCR) (NV-1) was used to control the pressure on device 100. A third pressure transducer (PT-3) was placed upstream of the vacuum pump to read the vacuum pressure. A drop pot was placed upstream of the vacuum pump to collect any condensation. A third valve (V-3) was placed between the drop pot and vacuum pump to be able to vent out the vacuum pressure. A second needle valve (NV-2) was also placed between the drop pot and vacuum pump to adjust the vacuum pressure if needed.

The output of device 100 was determined for all the parameters listed in Table 1 at two different water levels. First, device 100 was filled with 220 ml of DI water. With this volume of water, all the through-holes 124 on the bottom leg of the tubular support 120 of the membrane assembly 126 were submerged into water. In this case, device 100 was tested for the minimum output delivery for all the parameters listed in Table 1.

After determining the minimum delivery output, the device 100 was emptied and refilled with 1220 ml water.

This is the maximum volume of water that the chamber 110 can hold. Therefore, all the through-holes 124 of membrane assembly 126 were submerged in water. All testing was repeated to determine the maximum output delivery by device 100 for the listed parameters.

Figure 3:
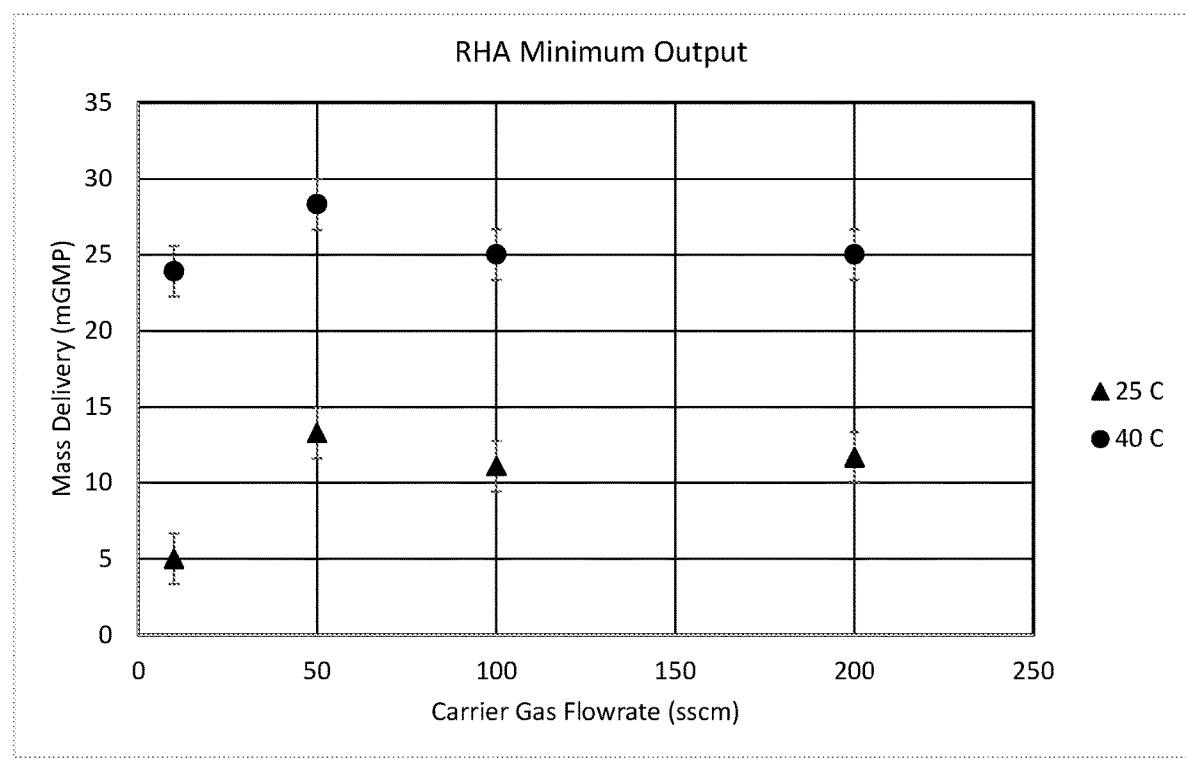
FIG. 3 is a graphical diagram showing exemplary results of RHA minimum output.

Table 1 and FIG. 3 provide a summary of the results for the Minimum output (at low level Solution) at 25° C. and 40° C. In Table 1, carrier gas flow rate of 1.0 sccm is equal to 0.001 slm. Each test was run at least two times. The mass delivery rates in the table are averaged of the results plus/minus the standard deviations.

TABLE 1

| Carrier Gas Flowrate (sccm) | Temperature (° C.) | Pressure (torr) | Exp. Mass Delivery (mGPM) |
|---|---|---|---|
| 10 | 24.7 | 50.5 | 5.0 ± 0.0 |
| 50 | 25.4 | 48.8 | 13.3 ± 0.0 |
| 100 | 25.7 | 50.0 | 11.1 ± 0.96 |
| 200 | 26.1 | 51.0 | 11.7 ± 0.0 |
| 10 | 39.0 | 49.1 | 23.9 ± 1.9 |
| 50 | 39.0 | 50.4 | 28.3 ± 0.0 |
| 100 | 39.0 | 50.6 | 25.0 ± 0.0 |
| 200 | 39.0 | 51.0 | 25.0 ± 0.0 |

Although the invention has been described with reference to the above description, it will be understood that modifications and variations are encompassed within the spirit and scope of the invention. Accordingly, the invention is limited only by the following claims.

What is claimed is:

1. A device comprising:
   (a) an enclosed chamber having a fill port, an inlet port and an outlet port, wherein the chamber is configured to contain a liquid;
   (b) a tubular support disposed within the chamber and having an interstitial space in fluid communication with the inlet port and the outlet port, wherein the tubular support comprises a plurality of through-holes disposed along a length thereof;
   (c) a membrane surrounding the tubular support, wherein the membrane permits passage therethrough of a vapor phase of the liquid, whereby the vapor phase passes through the membrane to contact a carrier gas or vacuum within the interstitial space to form a gas stream,
   wherein a concentration of the vapor at the outlet port is controlled by one or more of temperature of the chamber, pressure within the interstitial space, flow rate of the carrier gas, the number of holes disposed in the tubular support, the diameter of the holes disposed in the tubular support, and the alignment of the holes relative to a level of liquid within the chamber.

2. The device of claim 1, wherein the membrane is substantially impermeable to the carrier gas.

3. The device of claim 2, wherein the membrane permits the vapor phase of the liquid to pass therethrough at a vapor mass flow rate of about 10 gm/min to 0.01 mg/min.

4. The device of claim 1, further comprising a mass flow controller disposed at the inlet port, wherein the mass flow controller controls the flow rate of the carrier gas between about 100.0 slm and 0.001 slm.

5. The device of claim 1, further comprising a level detector disposed within the chamber, wherein the level detector monitors an amount or level of liquid in the chamber.

6. The device of claim 1, further comprising a downstream pressure controller disposed at the outlet port, wherein the pressure controller delivers the gas stream into a sub-atmospheric process.

7. The device of claim 6, wherein the pressure controller maintains a pressure of about 0-100 bar at the outlet or maintains a pressure of about 1 bar within the chamber.

8. The device of claim 1, further comprising a thermal controller disposed within the chamber, wherein the thermal controller adds heat to the carrier gas, adds heat to the chamber, removes heat from the carrier gas, or removes heat from the chamber.

9. The device of claim 1, wherein the liquid is selected from the group consisting of water, alcohol, hydrazine, and hydrogen peroxide.

10. The device of claim 1, wherein the carrier gas is selected from the group consisting of nitrogen, argon, hydrogen, clean dry air, helium, ammonia, ozone, carbon dioxide, carbon monoxide, oxygen, hydrocarbons, and mixtures thereof.

11. The device of claim 1, further comprising a thermal controller disposed on a carrier gas delivery line connected to the input port, wherein the thermal controller heats the carrier gas.

12. A method of delivering a gas stream comprising:
   (a) providing a liquid in the device of claim 1;
   (b) contacting a carrier gas or vacuum with the vapor phase of the liquid to form a gas stream within the interstitial space of the tubular support; and
   (c) delivering the gas stream out of the device, wherein a concentration of the vapor at the outlet port is controlled by one or more of temperature of the chamber, pressure within the interstitial space, flow rate of the carrier gas, the number of holes disposed in the tubular support, the diameter of the holes disposed in the tubular support, and the alignment of the holes relative to a level of liquid within the chamber.

13. The method of claim 12, wherein the membrane is substantially impermeable to the carrier gas.

14. The method of claim 12, wherein the vapor phase of the liquid passes through the membrane at a vapor mass flow rate of about 10 gm/min to 0.01 mg/min.

15. The method of claim 14, wherein the vapor phase of the liquid passes through the membrane at a vapor mass flow rate of about 1.0 gm/min to 1.0 mg/min.

16. The method of claim 12, wherein the device further comprises a mass flow controller disposed at the inlet port, wherein the mass flow controller controls flow rate of the carrier gas between about 100 slm and 0.001 slm.

17. The method of claim 12, wherein the device further comprises a level detector disposed within the chamber, wherein the level detector monitors an amount of liquid in the chamber.

18. The method of claim 12, wherein the device further comprises a downstream pressure controller disposed at the outlet port, wherein the pressure controller delivers the gas stream into a sub-atmospheric process.

19. The device of claim 18, wherein the pressure controller maintains a pressure of about 0-100 bar at the outlet or maintains a pressure of about 1 bar within the chamber.

20. The method of claim 12, wherein the device further comprises a thermal controller disposed within the chamber, wherein the thermal controller adds heat to the carrier gas, adds heat to the chamber, removes heat from the carrier gas, or removes heat from the chamber.

21. The method of claim 12, wherein when temperature and pressure of the device are held constant, the concentration of vapor in the gas stream is modulated based on a level of liquid within the chamber.

22. The method of claim 12, wherein the liquid is selected from the group consisting of water, alcohol, hydrazine, and hydrogen peroxide.

23. The method of claim 12, wherein the carrier gas is selected from the group consisting of nitrogen, argon, hydrogen, clean dry air, helium, ammonia, ozone, carbon dioxide, carbon monoxide, and mixtures thereof.

24. The method of claim 12, wherein the carrier gas is heated prior to the step of contacting.

25. The method of claim 12, further comprising during the step of contacting, degassing the liquid through an exhaust valve in fluid communication with a head space within the chamber, wherein the head space is adjacent to the liquid.

26. The method of claim 12, further comprising during the step of contacting, refilling the chamber with additional liquid.

* * * * *